United States Patent
Peng et al.

(10) Patent No.: US 7,663,237 B2
(45) Date of Patent: Feb. 16, 2010

(54) BUTTED CONTACT STRUCTURE

(75) Inventors: Yuan-Ching Peng, Hsinchu (TW);
Chloe Hsin-yi Chen, Toronto (CA);
David Hsu-Wei Lwu, Vancouver (CA);
Shyue-Shyh Lin, Hsinchu (TW);
Wei-Ming Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 581 days.

(21) Appl. No.: 11/320,512

(22) Filed: Dec. 27, 2005

(65) Prior Publication Data

US 2007/0145519 A1    Jun. 28, 2007

(51) Int. Cl.
*H01L 23/48* (2006.01)
(52) U.S. Cl. ............ 257/750; 257/752; 257/754; 257/E29.122; 257/E23.145
(58) Field of Classification Search ......... 257/758, 257/252, 401, 750, 752, 754, E29.122, E23.145
See application file for complete search history.

(56) References Cited

U.S. PATENT DOCUMENTS

| | | | |
|---|---|---|---|
| 5,804,846 A * | 9/1998 | Fuller | 257/252 |
| 6,239,458 B1 * | 5/2001 | Liaw et al. | 257/296 |
| 6,724,085 B2 * | 4/2004 | Tomita | 257/758 |
| 2002/0048939 A1 * | 4/2002 | Lee | 438/649 |
| 2005/0051854 A1 | 3/2005 | Cabral et al. | |
| 2005/0275043 A1 * | 12/2005 | Huang et al. | 257/401 |

FOREIGN PATENT DOCUMENTS

TW          550687 B       9/2003

OTHER PUBLICATIONS

Chatterjee, A., et al., "CMOS Metal Replacement Gate Transistors Using Tantalum Pentoxide Gate Insulator," IEDM, IEEE, 1998, pp. 777-780.
Yagishita, A., et al., "High Performance Damascene Metal Gate MOSFET's for 0.1 μm Regime," IEEE Transactions on Electron Devices, vol. 47, No. 5, May 2000, pp. 1028-1034.
Pan, J., et al., "Replacement Metal-Gate NMOSFETs with ALD TaN/EP-Cu, PVD Ta, and PVD TaN Electrode," IEEE Electron Device Letters, vol. 24, No. 5, May 2003, pp. 304-305.

* cited by examiner

*Primary Examiner*—Trung Dang
(74) *Attorney, Agent, or Firm*—Slater & Matsil, L.L.P.

(57) ABSTRACT

A semiconductor structure and a method of forming the same using replacement gate processes are provided. The semiconductor structure includes a butted contact coupling a source/drain region, or a silicide on the source/drain region, of a first transistor and a gate extension. The semiconductor structure further includes a contact pad over the source/drain region of the first transistor and electrically coupled to the source/drain region. The addition of the contact pad reduces the contact resistance and the possibility that an open circuit is formed between the butted contact and the source/drain region. The contact pad preferably has a top surface substantially leveled with a top surface of the gate extension.

15 Claims, 13 Drawing Sheets

BUTTED CONTACT STRUCTURE

TECHNICAL FIELD

This invention relates generally to a semiconductor structure and a processing method, and more particularly to a structure relating to a butted contact.

BACKGROUND

Butted contacts have been widely used for connecting semiconductor devices. Occupying less layout area, butted contacts are particularly suitable for laying out integrated circuits requiring high density such as static random access memory (SRAM) circuits.

Figure 1:
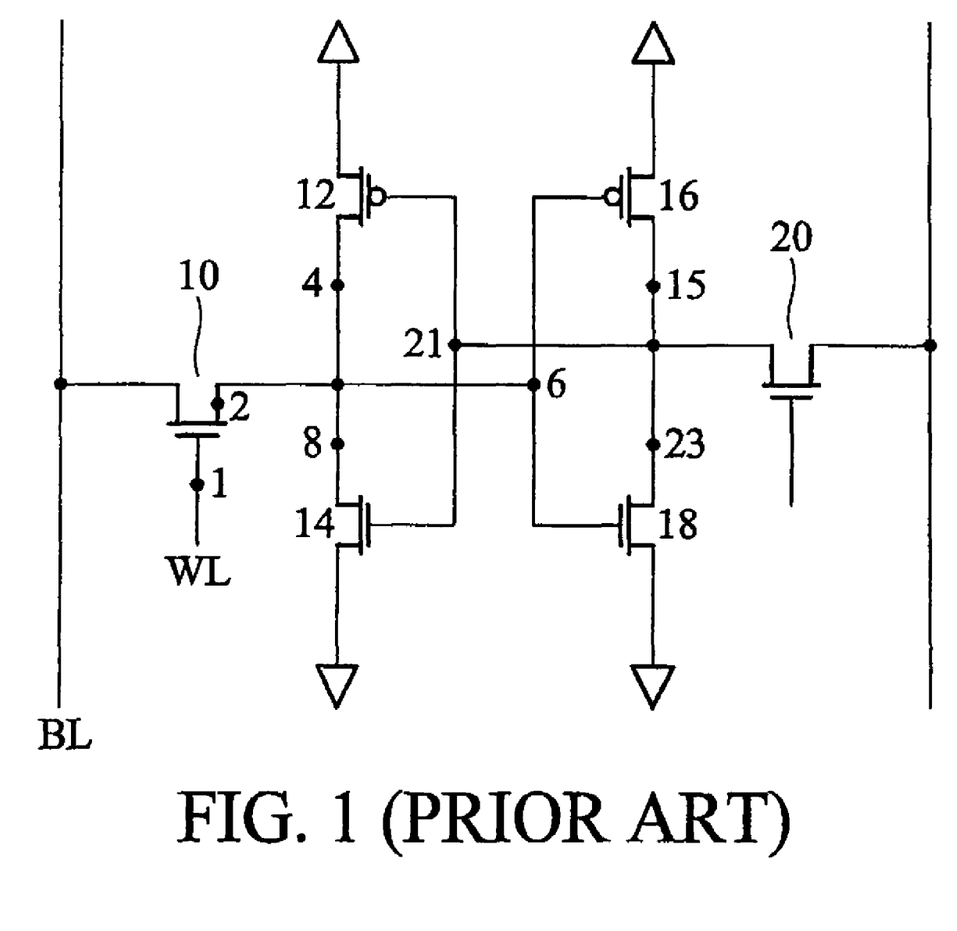
FIG. 1 illustrates a schematic circuit diagram of a typical six-transistor random access memory (6T SRAM) cell.
Figure 2:
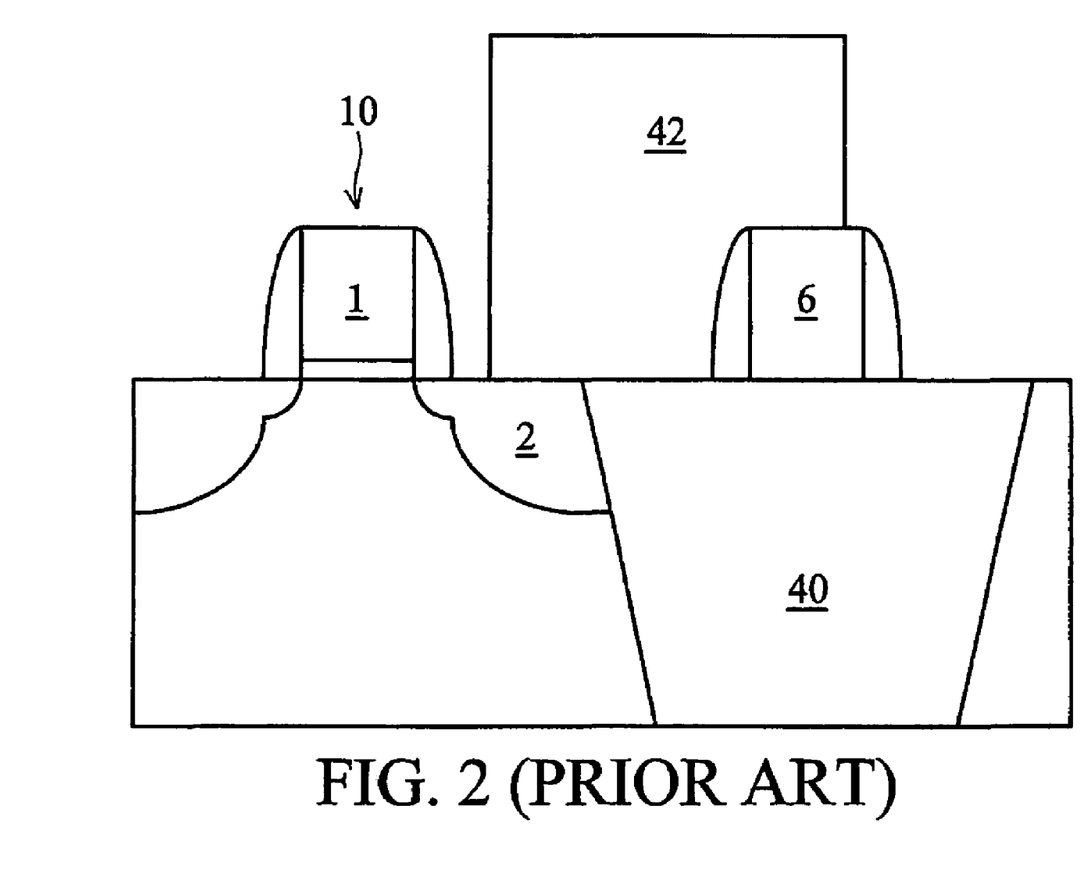
FIG. 2 illustrates a cross-sectional view of a butted contact coupled between a source region of one transistor and a gate extension of another transistor, wherein the butted contact has a vertical profile.

An example of the usage of butted contacts is illustrated in FIGS. 1 and 2. FIG. 1 illustrates a schematic circuit diagram of a conventional 6T SRAM cell. The 6T SRAM cell comprises a pass gate transistor 10 and a latch, which includes transistors 12, 14, 16 and 18. Gate 1 of the pass gate transistor 10 is controlled by a wordline WL that determines whether the current SRAM cell is selected or not. The latch, formed of pull up transistor 12, pull down transistor 14, and transistors 16, 18, stores a state. The stored state can be read through a bitline BL.

Butted contacts can be used on various connections in the circuit shown in FIG. 1. For example, the connection between the source region 2 of the pass gate transistor 10 and gate 6 of the transistors 16 and 18. Other connections that can be formed of butted contacts include connections between gate 6 of the transistors 16 and 18 and respective drains 4 and 8 of the transistors 12 and 14, and connections between gate 21 of the transistors 12, 14 and drains 15, 23 of the respective transistors 16 and 18.

Figure 3:
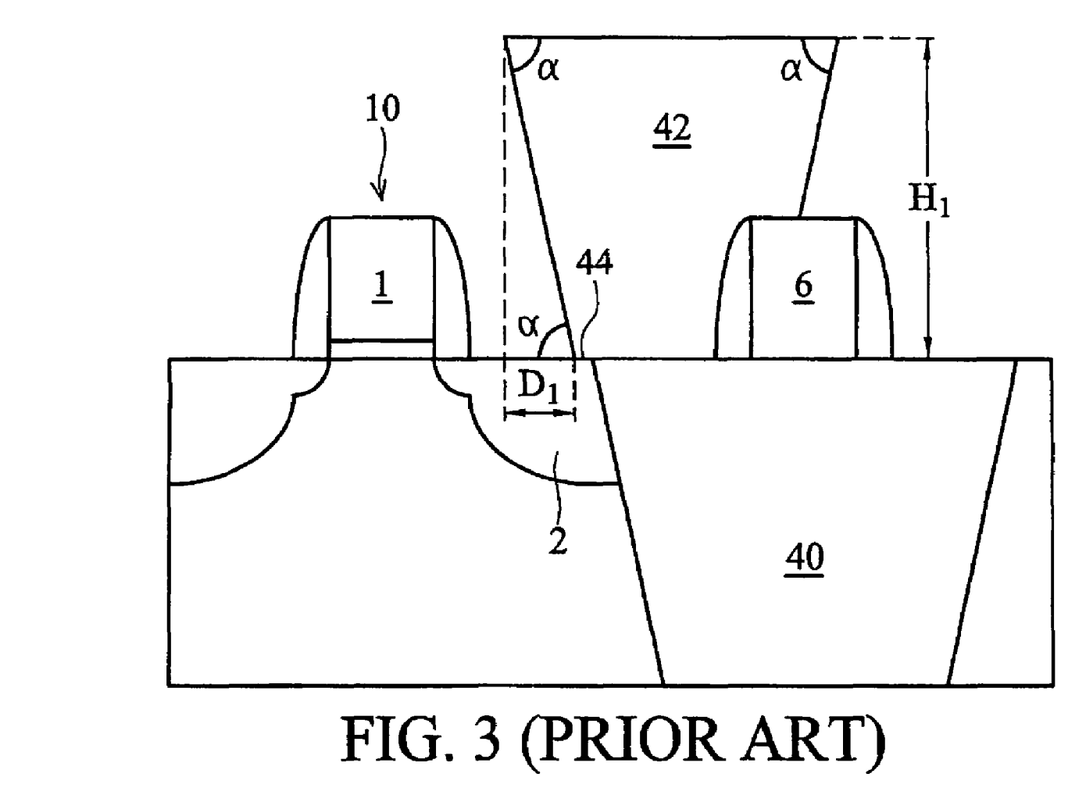
FIG. 3 illustrates a cross-sectional view of a butted contact, wherein the butted contact has a negative profile with the bottom portion narrower than the top portion.

FIG. 2 illustrates a cross-sectional view of a butted contact 42 formed between the source region 2 of the pass gate transistor 10 and a gate 6, or an extension of the gate 6, of the transistors 16 and 18 (not shown). Region 40 is a shallow-trench-isolation (STI). The conventional butted contact 42 suffers drawbacks. Due to etching loading effect during the formation processes, the butted contact 42 often has a non-vertical profile with the bottom portion narrower than the top portion, as illustrated in FIG. 3, and the bottom portion may have little or no overlapping portion 44 with the source region 2 of the transistor 10. As a result, the contact resistance increases. Even worse, if overlapping portion 44 completely disappears, an open circuit occurs, causing integrated circuit failure.

Therefore, there is the need for a novel butted contact design that overcomes the above-discussed problems.

SUMMARY OF THE INVENTION

In accordance with one aspect of the present invention, a semiconductor structure includes a butted contact coupled between a source/drain region, or a silicide layer on the source/drain region, of a first transistor and a gate/gate extension of a second transistor. A contact pad is formed between the butted contact and the source/drain region of the first transistor. The addition of the contact pad reduces contact resistance and the possibility that an open circuit will occur between the butted contact and the source/drain region. The contact pad preferably has a top surface substantially leveled with the top surface of the gate extension of the second transistor.

In accordance with another aspect of the present invention, a method of forming the semiconductor structure using replacement gate processes includes forming a transistor that has a dummy gate, blanket depositing an inter-layer dielectric (ILD) layer and planarizing the ILD layer to a top surface of the dummy gate, removing the dummy gate to form a first opening, removing a portion of the ILD layer to form a second opening and exposing at least a portion of a source/drain region of the first transistor through the second opening, and filling a metal into the first and second openings. The metal filled in the first opening forms the metal gate of the first transistor, and the metal filled in the second opening forms a contact pad. The method further includes forming a butted contact electrically coupling the contact pad and a gate extension over an STI, wherein the STI is adjacent the source/drain region, and the gate extension is preferably electrically coupled to a gate of a second transistor.

One advantageous feature of the preferred embodiment of the present invention is that the addition of the contact pad reduces recessing distance of the butted contact, thus it increases contact area, reduces contact resistance, and reduces the possibility of an open circuit. Another advantageous feature of the present invention is that the preferred embodiments are compatible with existing semiconductor manufacturing processes, and few (sometimes no) additional process steps and masks are required.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Butted contacts may have three possible profiles, which can be distinguished by a top angle α, as referred to in FIG. 3. It is worthy of notice that the dielectric layer bordering the butted contacts is neglected to simplify the drawing. Depending on whether the angle α is greater than, equal to, or less than 90 degrees, the profiles can be quantified and referred to as a positive profile, a vertical profile, or a negative profile, respectively. FIG. 2 illustrates a vertical profile, and FIG. 3 illustrates a negative profile. Typically, vertical profiles are preferred.

Due to etching loading effect, the profiles of the respective butted contacts in an integrated circuit are not uniform. If some of the butted contacts have substantially vertical profiles, other butted contacts may have positive or negative profiles. The profile of the butted contacts can be controlled by adjusting parameters of the forming processes, such as the over-etching time for etching/shaping the dielectric layer for the butted contacts. For example, when etching a dielectric layer to form an opening for the butted contact, if the over-etching time increases, the problem from the profile of the opening for the butted contact may be solved. However, it will induce side effects, such as a bird's beak of the opening.

Referring to FIG. 3, with a negative profile, the bottom portion of butted contact 42 is recessed a distance $D_1$. When the distance $D_1$ increases, the contact area between the source/drain region 2 and the butted contact 42 decreases, thus contact resistance increases. Eventually, if the angle $\alpha$ is small enough, the overlap 44 disappears and an open circuit occurs. The relationship between the recessing distance $D_1$ and height $H_1$ can be expressed as $D_1=H_1*\cot(\alpha)$, wherein $H_1$ is the height of the butted contact. The equation reveals that recessing distance $D_1$ can be reduced by approximating the angle $\alpha$ to 90 degrees and/or decreasing the height $H_1$.

Figure 4:
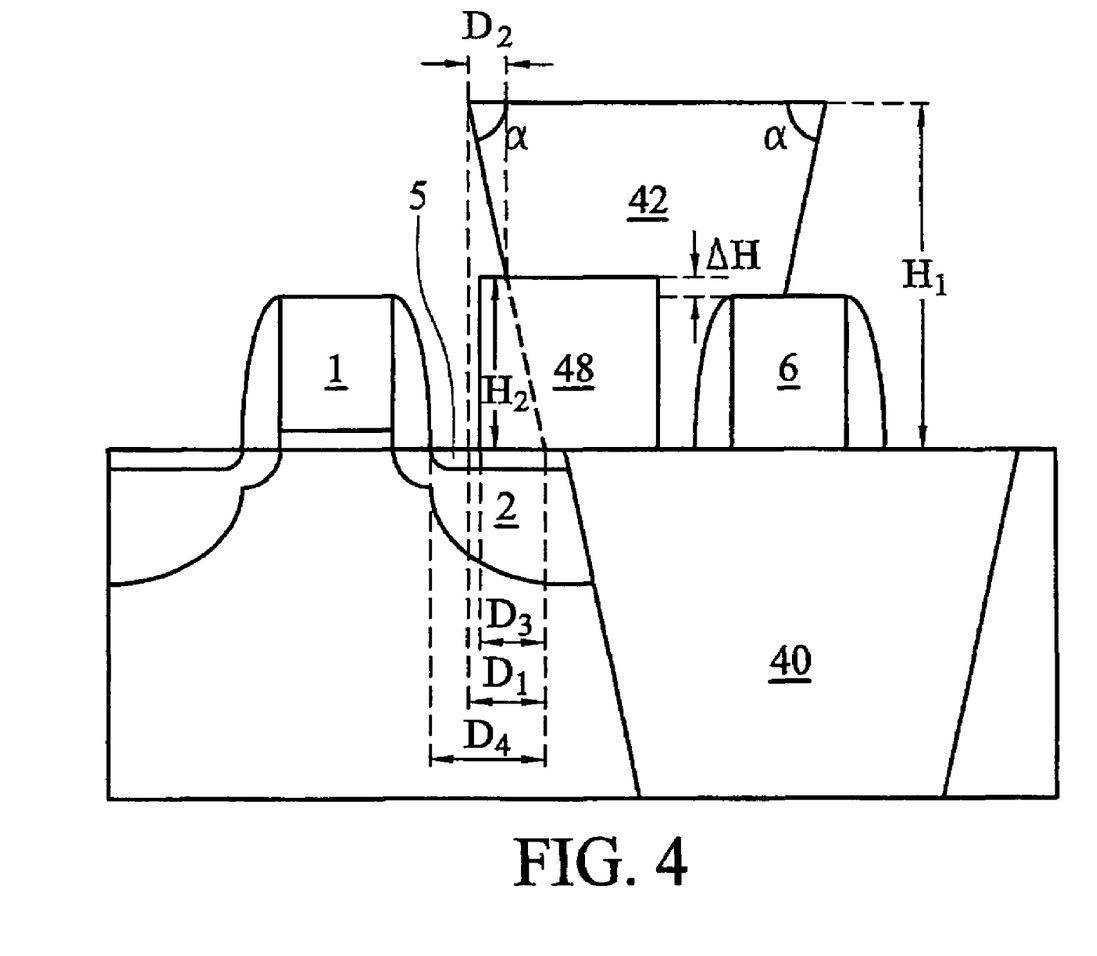
FIG. 4 illustrates a preferred embodiment of the present invention.

A preferred embodiment with a butted contact having a reduced recessing distance is illustrated in FIG. 4. A butted contact 42 couples a gate extension 6 and a source/drain region 2 of another transistor(s) with a contact pad 48 therebetween. The butted contact 42 preferably has a rectangular cross section. However, a tapered cross section is shown for easy discussion. The source/drain 2 may further include an overlying silicide layer 5. Although gate extension 6 is so named because it typically connects to a gate of another transistor(s) (not shown), it can connect to any other conductive feature. Contact pad 48 can be formed of known conductive materials such as metals, metal silicides, polysilicon, and the like, by known methods. However, even if the contact pad 48 is formed of silicide, its top surface is higher than that of conventional silicides. Note that the butted contact 42 has a recessing distance $D_2=\cot(\alpha)*(H_1-H_2)$, and thus is less than $D_1$. Preferably, the top surfaces of the contact pad 48 and gate extension 6 are substantially leveled. If the height different between the top surfaces of the contact pad 48 and gate extension 6 is represented by $\Delta H$, the height different $\Delta H$ is preferably less than about 10 percent of the height $H_2$ of the contact pad 48, and more preferably the height different $\Delta H$ is equal to zero.

Preferably, the contact pad 48 extends over the STI 40. To reduce contact resistance between the contact pad 48 and its underlying source/drain region 2, the overlapping portion between contact pad 48 and source/drain region 2 preferably has an overlap with a width $D_3$ of greater than 50 percent of the width $D_4$ of the source/drain region 2. More preferably, $D_3$ equals $D_4$. Because recessing distance $D_2$ is reduced, and also because the contact pad 48 extends over the STI 40, further increasing the contact area between contact pad 48 and its overlying butted contact 42, the possibility of open circuits is substantially eliminated and the contact resistance is significantly reduced.

One advantageous feature of the preferred embodiments of the present invention is that there are less additional process steps involved, although an extra contact pad 48 is introduced. With careful design, the formation of the contact pad can be integrated into existing manufacturing processes with no additional process step and mask required. FIGS. 5 through 13 illustrate a preferred embodiment using replacement gate processes, wherein semiconductor devices having dummy gates, spacers, and source/drain regions are formed, and a thermal annealing is performed. Metal gates then replace the dummy gates. Through such replacement processes, the adverse effects caused by the thermal annealing to the metal gates are avoided.

Figure 5:
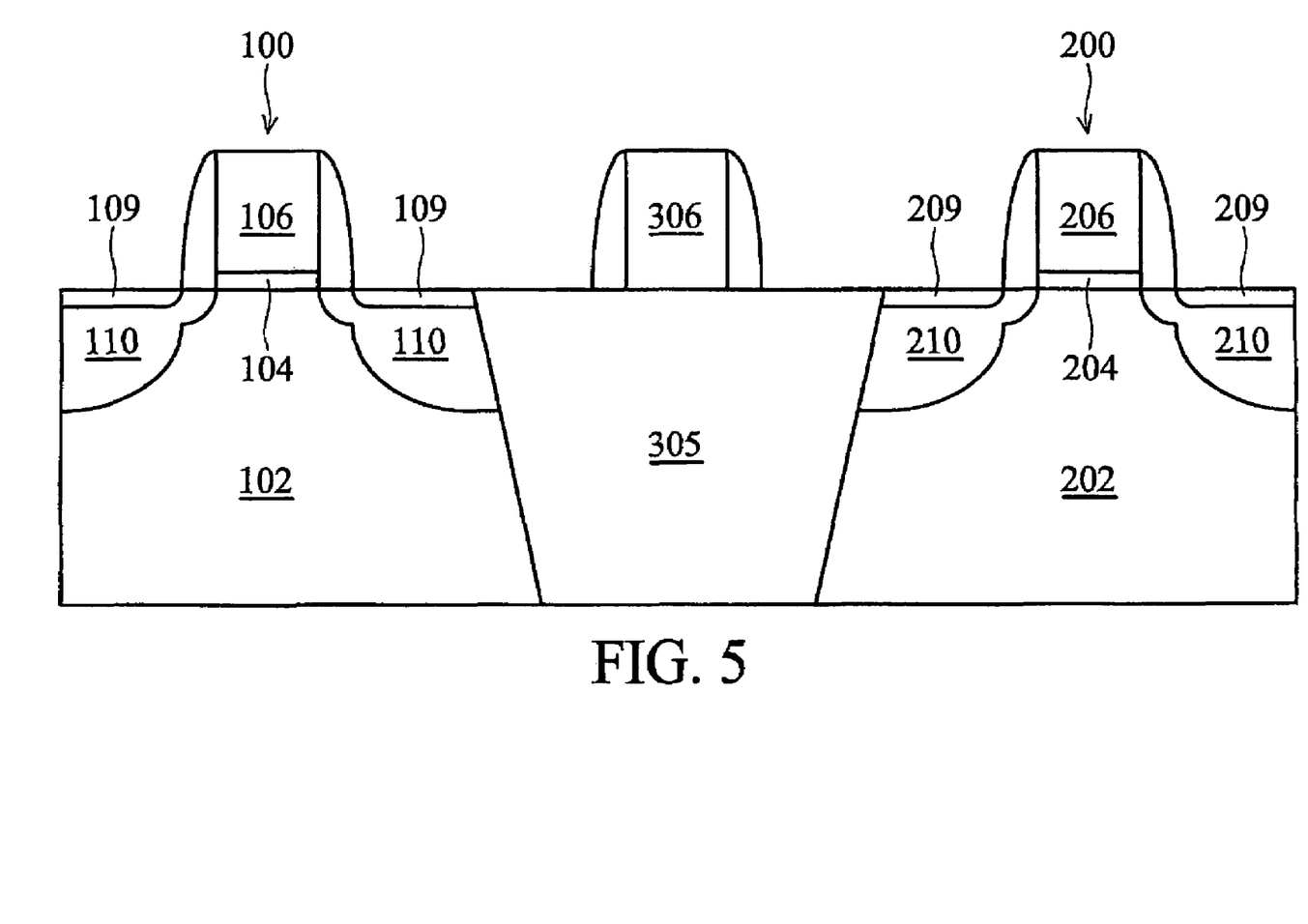
FIGS. 5 through 13 illustrate cross-sectional views of intermediate stages in the manufacture of preferred embodiments of the present invention.

FIG. 5 includes a pMOS transistor 100 and an nMOS transistor 200 separated by a shallow trench isolation (STI) 305. The substrate region 102 is preferably doped to form an n-well, and substrate region 202 is preferably dope to form a p-well. It is to be note that although transistors 100 and 200 are shown to be closely located, in the practical case, they are typically spaced apart. In the preferred embodiment, the gate dielectrics 104 and 204 are formed of $HfO_2$. In other embodiments, the gate dielectrics 104 and 204 comprise silicates such as $HfSiO_4$, HfSiON, HfSiN, $ZrSiO_4$, and the like. Other materials such as metal oxides, metal nitride, and transition metal silicate can also be used. The source/drain regions 110 and 210 are formed for respective devices 100 and 200, and are activated, preferably by thermal annealing. Source/drain regions 110 and 210 are preferably semiconductor materials doped with appropriate p-type and n-type impurities, respectively, and may include silicide sub layers 109 and 209 over the respective semiconductor materials 110 and 210.

In the preferred embodiment, dummy gates 106 and 206 are formed of two layers with a TaN layer on an HfN layer. In other embodiments, dummy gates 106 and 206 are formed of polysilicon. A gate extension 306, which is preferably connected to a gate of a separate transistor (not shown), is formed over the STI 305. However, the gate extension 306 can also be electrically coupled to other components of the semiconductor devices, such as source/drain regions, contacts, etc. Gate extension 306 can be formed of polysilicon or other conductive materials such as metals.

Figure 6:
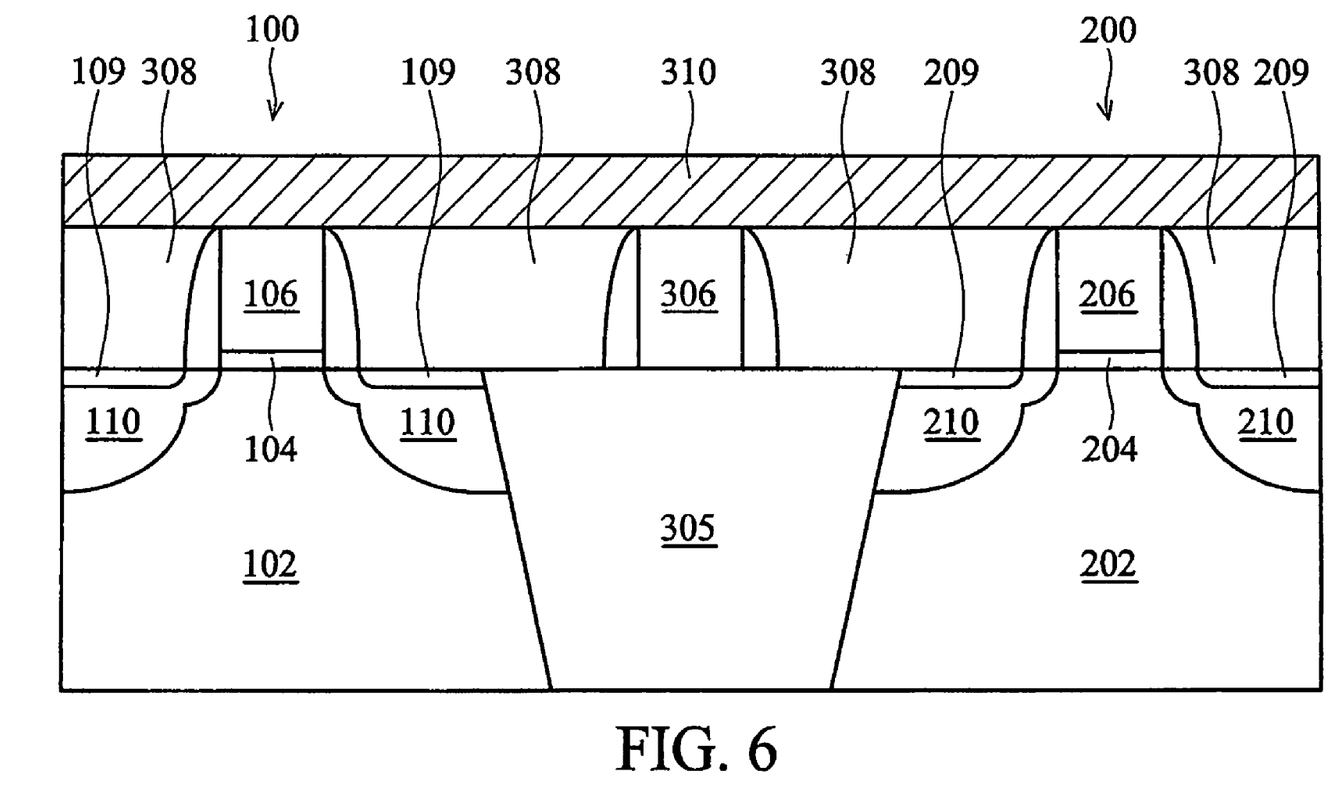

As shown in FIG. 6, an inter-layer dielectric (ILD) layer is blanket deposited and then planarized, stopping at the dummy gates 106 and 206 level, and thus forming the ILD layer 308.

Figure 7:
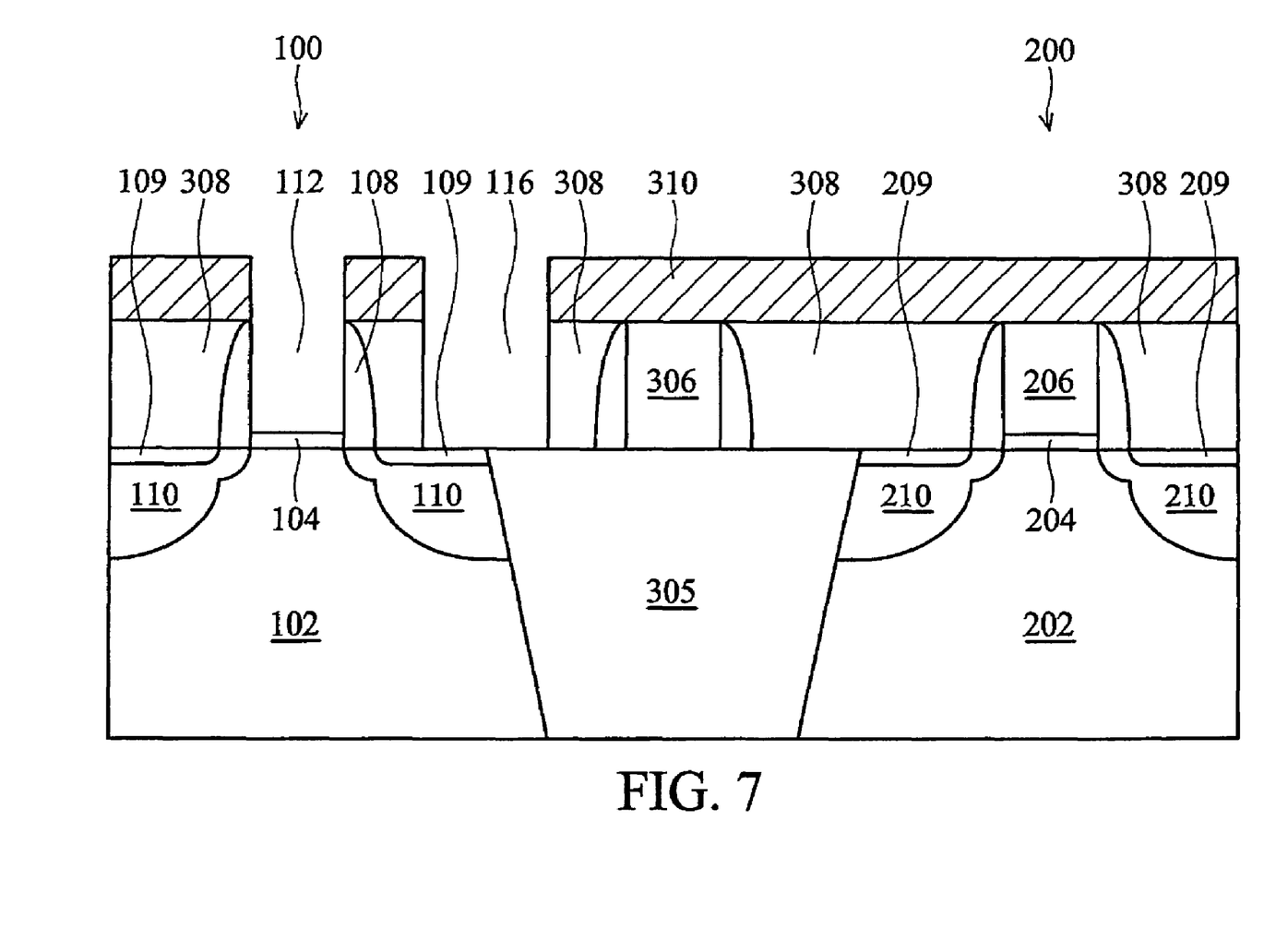

A photo resist 310 is then formed and patterned. In the preferred embodiment, an anisotropic etching, which attacks dummy gate 106 and ILD 308, but not other materials, removes the dummy gate 106, and thus an opening 112 is formed, as shown in FIG. 7. Simultaneously, an opening 116 is also formed in the ILD 308. For example, an etchant including HBr, Cl, $O_2$, $CH_2F_2$, $CHF_3$, $CF_4$, and Ar can etch a poly dummy gate 106 and an ILD 308 formed of phosphor-silicate glass (PSG) or $SiO_2$. In other embodiments, the openings 112 and 116 can be formed successively, preferably by using HBr, Cl, or $O_2$, to etch poly dummy gate 106 and $CF_4$ to etch ILD 308 formed of PSG or SiO2. Through the opening 116, the source/drain region 110 of the device 100 is exposed. For the resulting butted contacts to have low contact resistance, the opening 116 is preferably adjacent to spacer 108, although it may be spaced apart from the spacer 108 if desired, as shown in FIG. 7, to minimize adverse consequences of misalignment. The opening 116 preferably extends over STI 305.

Figure 8:
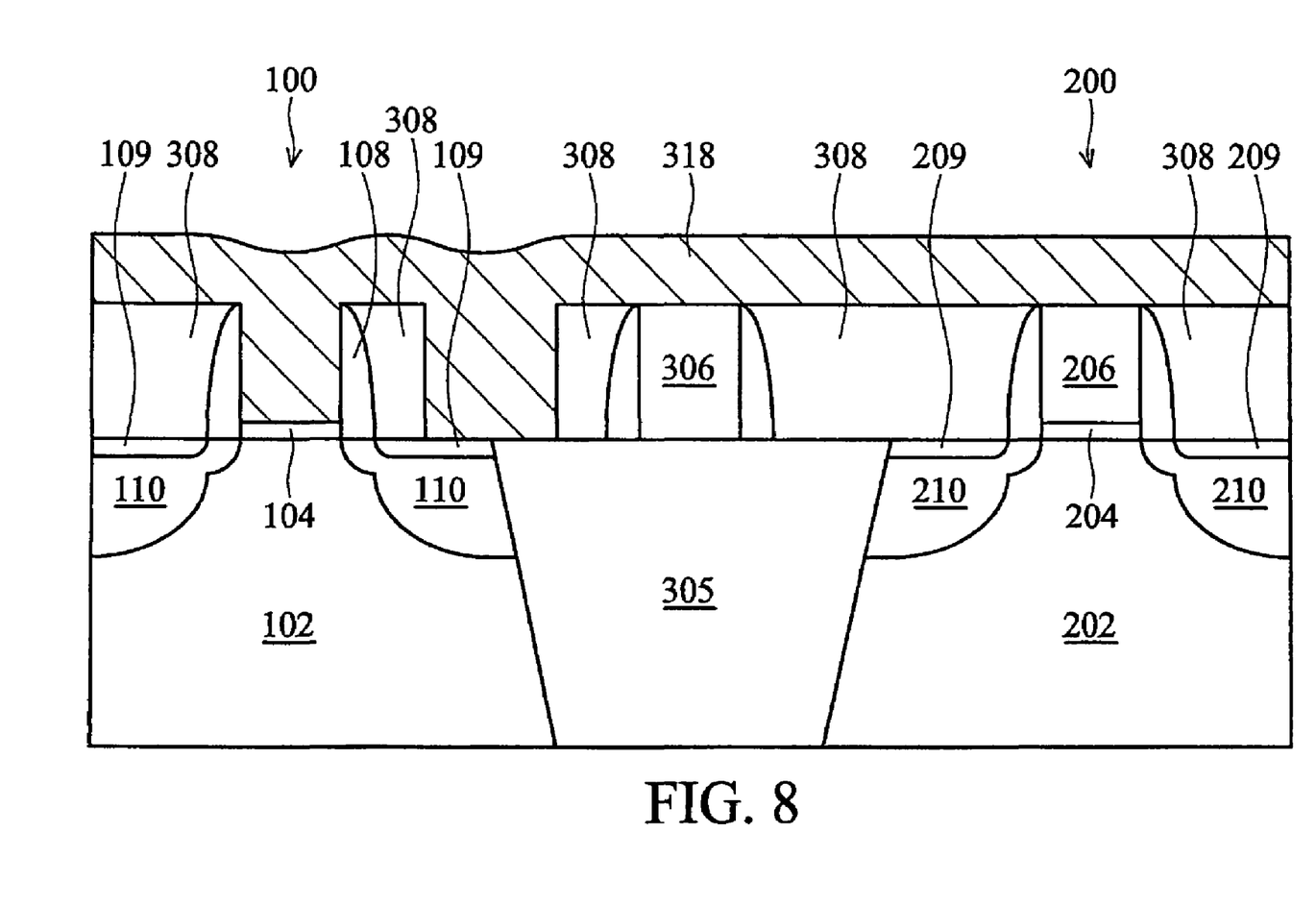
Figure 9:
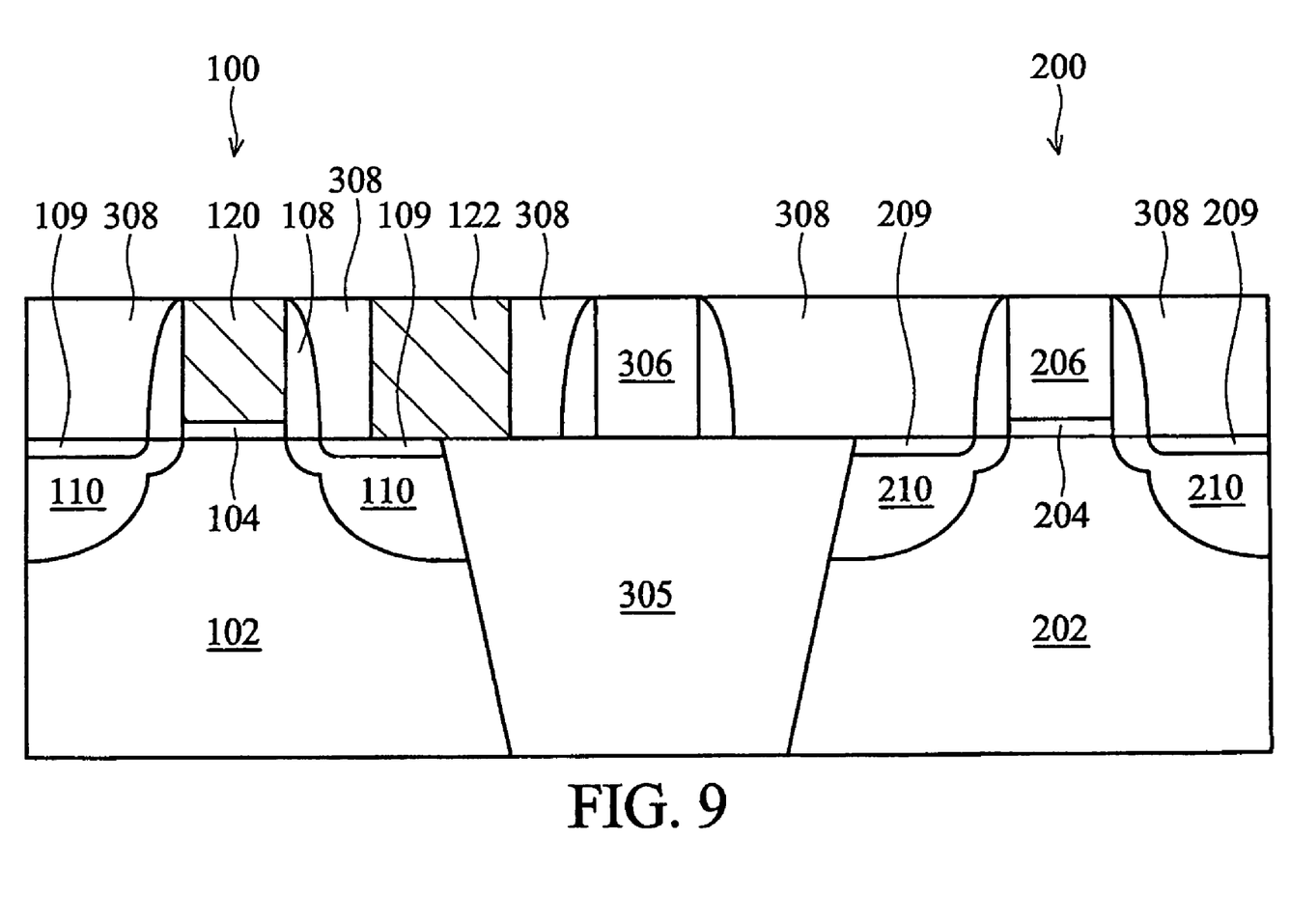

FIG. 8 illustrates that a metal layer 318 is deposited, filling the openings 112 and 116. The metal layer 318 is then planarized, preferably by using chemical mechanical polish. Preferably, the metal layer 318 comprises a metal(s) having a high work function(s). As shown in FIG. 9, the portions of metal layer 318 remaining in the openings 112 and 116 form a metal gate 120 and a contact pad 122, respectively.

Figure 10:
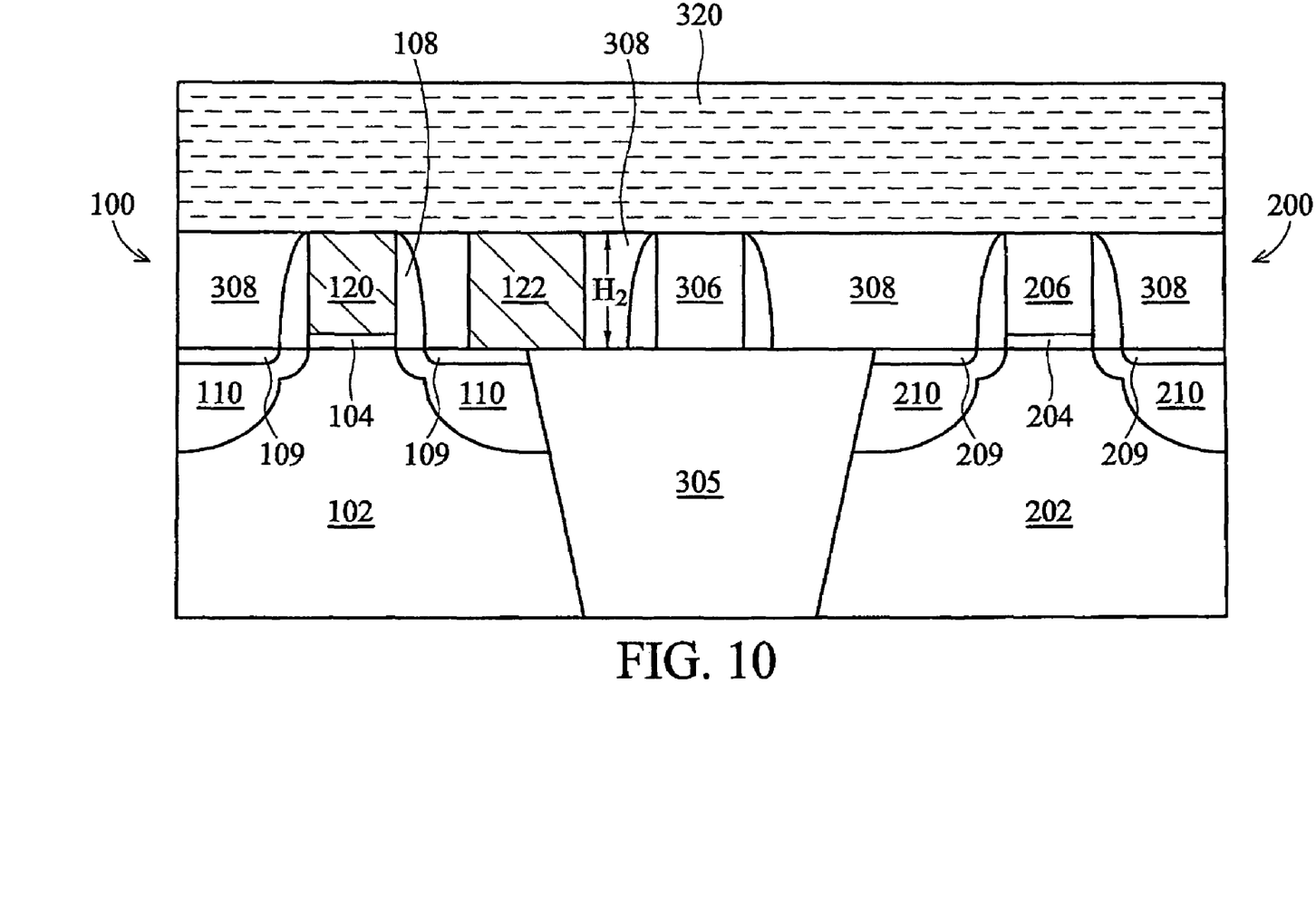

As illustrated in FIG. 10, an additional inter-level dielectric (ILD) layer 320 is deposited over the previously formed structure. The additional ILD layer 320 preferably has a low dielectric constant (k) value and is preferably deposited using, e.g., tetraethyl orthosilicate (TEOS), CVD, PECVD, LPCVD, or other well-known deposition techniques. The additional ILD layer 320 provides insulation between the MOS devices 100, 200 and overlying metal lines. As is well known in the art, a contact etch stop layer (not shown) may be formed underlying the additional ILD dielectric layer 320. For simplicity purposes, the contact etch stop layer is not shown.

Figure 11:
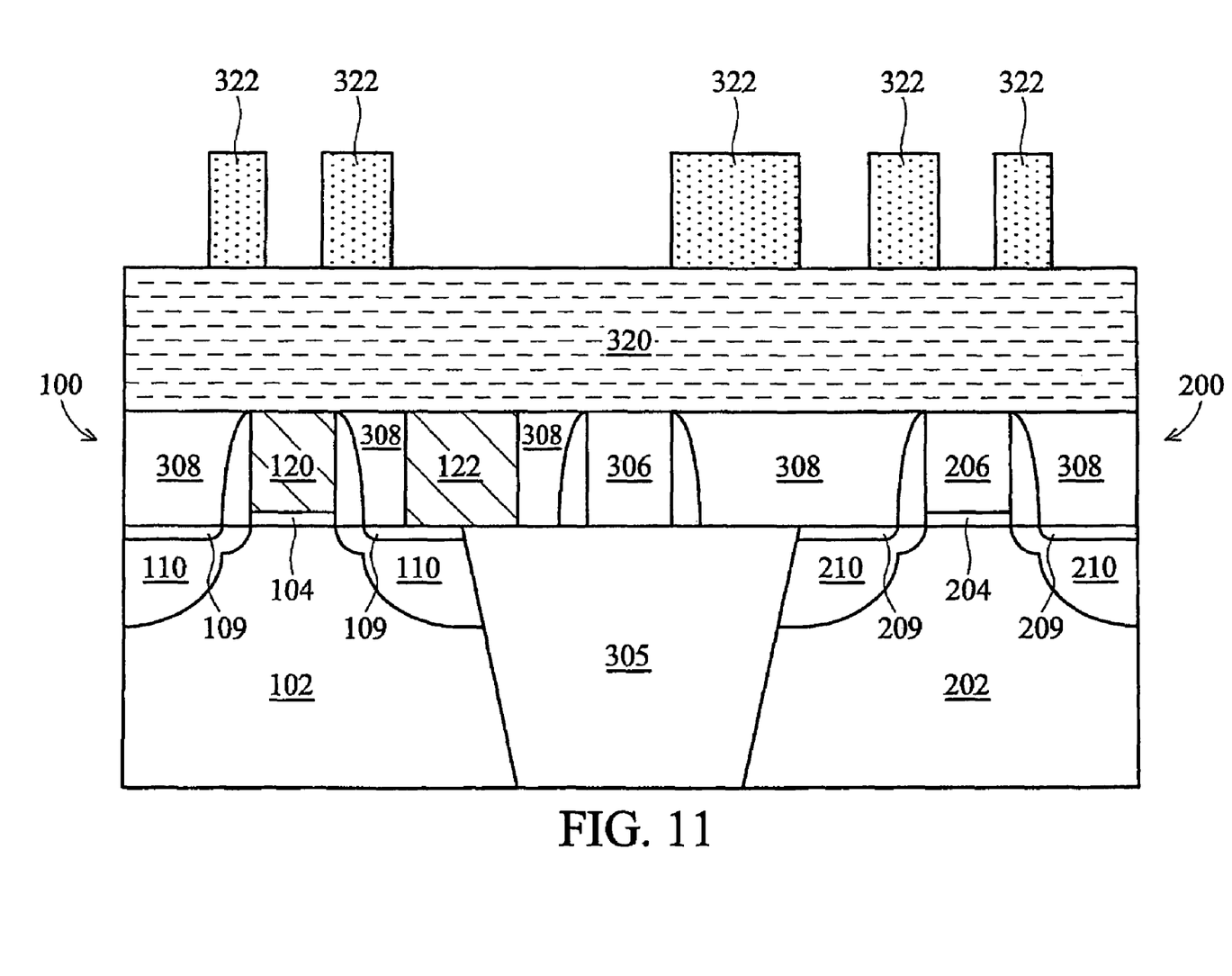
Figure 12:
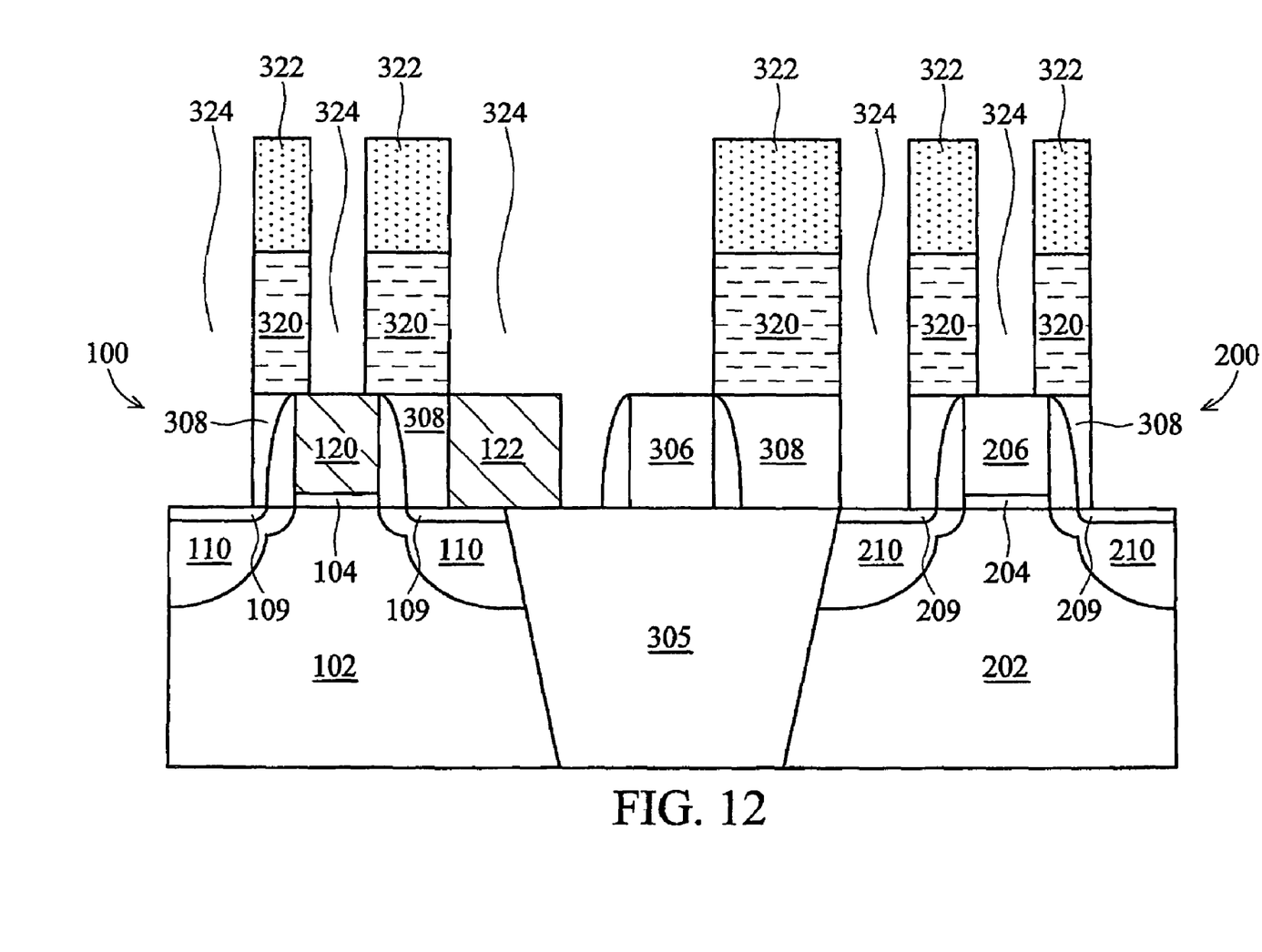

Referring to FIG. 11, a photo resist 322 is formed and patterned over the additional ILD layer 320 in order to form contact openings. FIG. 12 illustrates a structure after the exposed portions of the additional ILD layer 320 and ILD layer 308 have been etched away, thus forming contact openings 324. The photo resist 322 is then removed.

Figure 13:
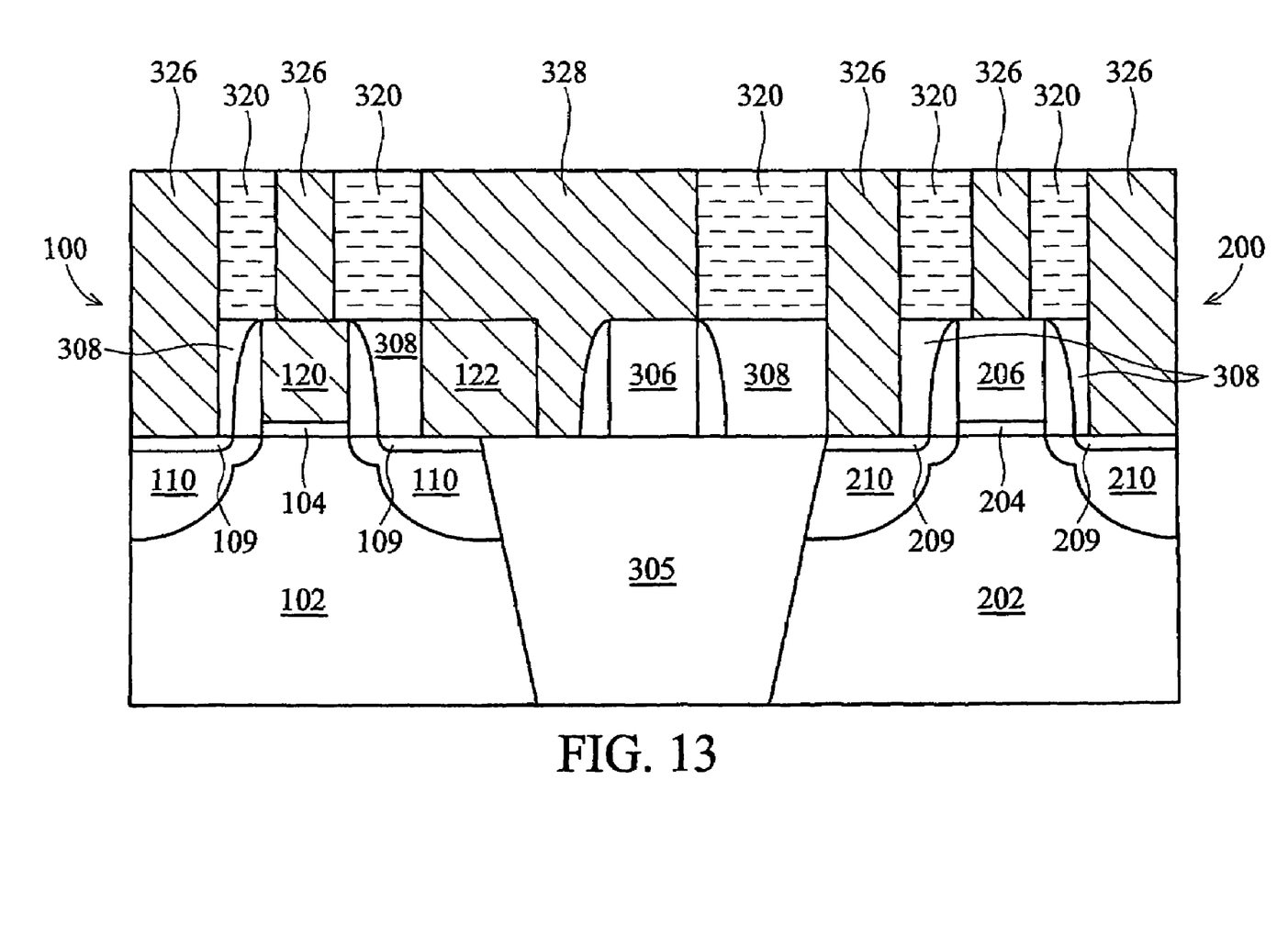

FIG. 13 illustrates the formation of metal plugs 326 and a butted contact 328 in the contact openings, preferably by filling the openings 324 will a conductive material, and performing a chemical mechanical polish to remove excessive material, leaving the metal plugs 326 and butted contact 328. The metal plugs 326 and butted contact 328 may be formed of tungsten, aluminum, copper, or other well-known alternatives. The metal plugs 326 and butted contact 328 may also have composite structures, including, e.g., barrier and adhesion layers, such as titanium/titanium nitride or tantalum nitride, and other layers as well.

It is to be noted that the preferred embodiment shown in FIG. 4 can be used for connecting other conductive features such as contacts, conductive lines, and components of the semiconductor devices deemed appropriate, and is not limited to connecting source/drain regions and gates. By applying the concept of adding a contact pad, thus reducing the heights of the butted contacts in order to reducing recessing distances and increasing contact areas, the reliability and contact resistances can be improved.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. For instance, the accompanying drawings are for illustrative purposes only and are not drawn to scale. May featured devices, no necessary to understanding the invention, have been omitted for clarity. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a shallow trench isolation (STI) in a substrate;
   a first transistor comprising a gate electrode over the substrate and a source/drain region, the source/drain region being adjacent the STI;
   a gate extension over the STI and coupled to a gate of a second transistor;
   a butted contact overlying and electrically coupled to the gate extension; and
   a contact pad electrically coupled between the butted contact and the source/drain region of the first transistor, wherein the contact pad is underlying the butted contact, and wherein the contact pad has a top surface substantially level with a top surface of the gate extension.

2. The semiconductor structure of claim 1 further comprising a source/drain silicide on the source/drain region and underlying the contact pad.

3. The semiconductor structure of claim 1 wherein the gate extension has a first height, the contact pad has a second height, and wherein the first and the second heights have a height difference of less than about 10 percent of the first height.

4. The semiconductor structure of claim 1 wherein the butted contact has a negative profile with a bottom portion narrower than a top portion.

5. The semiconductor structure of claim 1 wherein at least a portion of the contact pad substantially overlaps the source/drain region.

6. The semiconductor structure of claim 1 wherein the contact pad extends substantially over the STI.

7. The semiconductor structure of claim 1 wherein the gate electrode is formed of a material comprising a metal, and wherein the gate electrode and the contact pad are formed of substantially the same material.

8. The semiconductor structure of claim 1 wherein the contact pad comprises a material selected from the group consisting essentially of metal, metal silicide, polysilicon, and combinations thereof.

9. A semiconductor structure comprising:
   a semiconductor substrate;
   an isolation structure extending from a top surface of the semiconductor substrate into the semiconductor substrate;
   an inter-layer dielectric (ILD) layer over the semiconductor substrate;
   a first transistor comprising:
      a first and a second source/drain region underlying the ILD layer, the first source/drain region being adjacent the isolation structure;
      a first and a second silicide between the ILD layer and respective first and second source/drain regions; and
      a gate electrode in the ILD layer, the gate electrode being between the first and second source/drain regions and having a top surface substantially level with a top surface of the ILD layer;
   a contact pad in the ILD layer and on the first silicide;
   a gate extension over the isolation structure; and
   a butted contact electrically coupling the contact pad and the gate extension.

10. The semiconductor structure of claim 9 wherein the contact pad and the gate electrode of the first transistor have substantially level top surfaces.

11. The semiconductor structure of claim 9 wherein the contact pad has a first portion substantially overlapping the first source/drain region of the first transistor.

12. The semiconductor structure of claim 9 wherein the contact pad has a second portion extending over the isolation structure.

13. The semiconductor structure of claim 9 wherein the gate extension is electrically coupled to a gate of a second transistor.

14. A semiconductor structure comprising:
   a transistor comprising a source/drain region;
   a dielectric layer adjacent the source/drain region;
   a conductive feature over the dielectric layer, wherein the conductive feature has a top surface substantially higher than a top surface of the source/drain region;
   a contact pad over the source/drain region and electrically coupled to the source/drain region, wherein the contact pad has a top surface substantially level to the top surface of the conductive feature; and
   a butted contact connecting the contact pad and the conductive feature.

15. The semiconductor structure of claim 14 further comprising a silicide layer between the source/drain region and the contact pad.

* * * * *